United States Patent
Linde

(10) Patent No.: US 10,518,496 B2
(45) Date of Patent: Dec. 31, 2019

(54) PRESS FOR PRESSING A THERMOPLASTIC COMPOSITE COMPONENT

(71) Applicant: Airbus Operations GmbH, Hamburg (DE)

(72) Inventor: Peter Linde, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 50 days.

(21) Appl. No.: 15/612,313

(22) Filed: Jun. 2, 2017

(65) Prior Publication Data

US 2017/0348937 A1    Dec. 7, 2017

(30) Foreign Application Priority Data

Jun. 3, 2016  (EP) .................................. 16172910

(51) Int. Cl.
| | |
|---|---|
| *B29C 43/52* | (2006.01) |
| *B30B 1/42* | (2006.01) |
| *B29C 70/46* | (2006.01) |
| *B29C 33/22* | (2006.01) |
| *B30B 15/34* | (2006.01) |

(52) U.S. Cl.
CPC ................ *B30B 1/42* (2013.01); *B29C 33/22* (2013.01); *B29C 70/46* (2013.01); *B30B 15/34* (2013.01)

(58) Field of Classification Search
CPC .................................. B30B 1/42; B29C 43/52
See application file for complete search history.

(56) References Cited

U.S. PATENT DOCUMENTS

| | | | | |
|---|---|---|---|---|
| 5,747,179 A | * | 5/1998 | Matsen | ................... B29C 33/06 425/389 |
| 6,979,807 B2 | * | 12/2005 | Anderson | ............... B29C 33/04 156/379.6 |
| 8,372,327 B2 | * | 2/2013 | Matsen | ................... B29C 33/06 264/258 |
| 2010/0186882 A1 | | 7/2010 | Edelmann et al. | |
| 2011/0006460 A1 | | 1/2011 | Vander Wel et al. | |

FOREIGN PATENT DOCUMENTS

| | | |
|---|---|---|
| DE | 3818599 | 12/1988 |
| DE | 3818599 A1 | 12/1988 |
| DE | 102007037649 | 2/2009 |
| FR | 1340193 | 10/1963 |
| FR | 1340193 A | 10/1963 |

(Continued)

OTHER PUBLICATIONS

European Search Report; priority document.
European Search Report, dated Oct. 7, 2016, priority document.

*Primary Examiner* — Joseph S Del Sole
*Assistant Examiner* — Thu Khanh T Nguyen
(74) *Attorney, Agent, or Firm* — Greer, Burns & Crain, Ltd.

(57) ABSTRACT

A press for pressing a component, such as a thermoplastic consolidation and/or forming press, has a first fixed part as a first pressing tool, a movable part as a second pressing tool for pressing a component together with the first pressing tool, and a second fixed part for applying a pressing force to the movable part, wherein the second fixed part and the movable part apply the pressing force generated via interaction between a magnetic field of a pressing magnet and a superconductor cooled below its step temperature.

15 Claims, 6 Drawing Sheets

(56) References Cited

FOREIGN PATENT DOCUMENTS

| | | |
|---|---|---|
| JP | S63 252696 | 10/1988 |
| JP | S63252696 A | 10/1988 |
| JP | H03 145169 | 6/1991 |
| JP | H03145169 A | 6/1991 |
| JP | 2001 150192 | 6/2001 |
| JP | 2001150192 A | 6/2001 |
| JP | 2008023559 | 2/2008 |
| JP | 2008023559 A | 2/2008 |

* cited by examiner

PRESS FOR PRESSING A THERMOPLASTIC COMPOSITE COMPONENT

CROSS-REFERENCES TO RELATED APPLICATIONS

This application claims the benefit of the European patent application No. 16172910.8 filed on Jun. 3, 2016, the entire disclosures of which are incorporated herein by way of reference.

FIELD OF THE INVENTION

The present invention pertains to a press for pressing a component, in particular a thermoplastic consolidation and/or forming press, and to a method for pressing a thermoplastic composite component, in particular for consolidation and/or forming, especially with such a press.

Although applicable to any kind of pressing process, the present invention and the problem on which it is based will be explained in greater detail with reference to pressing a thermoplastic composite component of an aircraft or spacecraft, in particular commercial aircraft, for consolidation.

BACKGROUND OF THE INVENTION

Thermoplastic composites normally provide excellent mechanical behavior in terms of ductility, damage tolerance and very slow crack growth. Furthermore, they are environmentally comparably clean. If properly utilized, this this is an ideal material for civil aircraft.

One of the most efficient ways to produce thermoplastic laminates or shells is by fast lay-up and subsequent consolidation by a thermal press, so called "press consolidation." Subsequent forming is still possible, e.g., in a subsequent forming press. For example, document DE 10 2007 037 649 A1 describes consolidation and subsequent forming of a thermoplastic fiber composite component.

SUMMARY OF THE INVENTION

It is an idea of the present invention to provide for an improved press, in particular a thermoplastic consolidation and/or forming press. Furthermore, it is another idea of the present invention to provide for an improved method for pressing a thermoplastic composite component, in particular for consolidation and/or forming.

According to one aspect, therefore, the present invention provides a press for pressing a component, in particular a thermoplastic consolidation and/or forming press, comprising: a first fixed part comprising a first pressing tool; a movable part comprising a second pressing tool for pressing a component together with the first pressing tool; and a second fixed part for applying a pressing force to the movable part, wherein the second fixed part and the movable part are configured for applying the pressing force generated by means of interaction between a magnetic field of a pressing magnet and a superconductor cooled below its step temperature.

According to another aspect, the present invention provides a method for pressing a thermoplastic composite component, in particular for consolidation and/or forming, in particular with a press according to the invention, the method comprising: placing a thermoplastic composite component to be formed into a first pressing tool of a press in an open state thereof; closing the press by moving a movable part of the press comprising a second pressing tool into a closed state; and applying a pressing force on the movable part by means of applying a magnetic field with a pressing magnet and cooling a superconductor interacting with the magnetic field below its step temperature.

One idea of the present invention is to use the Meissner-Ochsenfeld effect of a superconductor in a magnetic field for application of a pressing force in a press for pressing a component.

In particular, the press is configured as a thermoplastic consolidation press.

Especially, the press is configured as a thermal press for consolidation of thermoplastic composite components. Alternatively or in addition, the press may be configured as forming press.

For production of thermoplastic composites, it is aimed to achieve increased automation in manufacturing. The thermoplastic composite material does indeed suit itself in many ways for automation, since it can be, in particular, welded, re-welded, formed and/or reformed by heating and cooling it in an arbitrary manner.

According to the invention, the press is configured for pressing a component by means of a movable part arranged between a first fixed part and a second fixed part. The first fixed part and the movable part each comprise a pressing tool cooperating with each other for pressing the component.

The second fixed part is configured for applying a pressing force to the movable part. In this way, the pressing force is transferred to the pressing tools.

In particular, a cryostat is provided and configured for cooling a super conducting material below its step temperature to form a diamagnet (Meissner-Ochsenfeld effect). The pressing force is applied by establishing a magnetic field interacting with the diamagnetic superconductor.

In this way, heavy and bulky hydraulic equipment of a press can be omitted. Furthermore, there are no more mechanically moved parts necessary for applying pressure. Accordingly, there is no mechanical wear. In this way, inspection of the press is simplified.

Furthermore, the press according to the invention has functional advantages over hydraulic presses. In particular, pressure can be attained faster since the Meissner Ochsenfeld effect occurs immediately when the pressing magnet is activated, if the superconductor is cooled below its step temperature.

Additionally, the invention allows providing individual application of pressure and time duration thereof, since a modular tool design with multiple moving parts of the press is possible.

Additionally, the press according to the invention is more efficient compared to a hydraulic press In particular, the press of the invention has lower energy consumption and thus is more environmentally friendly.

The pressing of a component according to the present invention, in particular, may comprise heating, impregnation, consolidation, forming, reforming and/or converting of the component.

The movable part of the press can be configured as a linearly movable part. However, also other kinematic concepts for movement, such as, for example, a leveraging mechanism driven by the interaction between the magnetic field of the pressing magnet and the superconductor cooled below its step temperature, may be applied.

Interaction between a magnetic field of a pressing magnet and a superconductor cooled below its step temperature according to the present invention is based on the Meissner-Ochsenfeld effect. The superconductor, also called a type 1 superconductor, has a step temperature, also called a critical temperature or transition temperature, which is dependent on the super conducting material used.

Once the temperature of the superconductor is below the step temperature, the superconductor forms a diamagnet due to the Meissner Ochsenfeld effect. Therefore, if the pressing magnet is active, the superconductor expels the magnetic field such that a field of resulting forces is generated. These forces, according to the present invention, are used as pressing force.

The first fixed part and the second fixed part are provided for abutting the pressing force and its reaction force. This means, "fixed" is to be understood such that the first fixed part is fixed relative to the second fixed part, such that the pressing force can be abutted. However, according to an embodiment, the first fixed part or the second fixed part or both may be absolutely fixed.

According to an embodiment of the press, the superconductor is configured fixed with the movable part. Accordingly, the superconductor is movable only together with the movable part relative to the first and second fixed parts. In particular, the superconductor is formed integrated with the movable part, for example in form of a super conducting material block inside the movable part. For example, the movable part further comprises a cryostat configured for cooling super conducting material of the super conductor below its step temperature to form a diamagnet. The cryostat may be, at least partially, also integrated into the movable part. In particular, the super conducting material is arranged inside the cryostat. In this way, a compact design is provided.

According to an embodiment, the pressing magnet is configured attached to the second fixed part. The attachment, for example, may be formed as removable fixation. Alternatively or in addition, the pressing magnet may be formed integrated in the second fixed part. In this way, a magnetic field can be established at the second fixed part by means of the pressing magnet. The magnetic field interacts with the superconductor to apply the pressing force to the movable part and press it towards the first fixed part. In this way, the pressing force can be applied by activation of the pressing magnet. When the pressing magnet is inactive, no pressing force is applied. In particular, the movable part may then be lifted again.

According to an embodiment, the movable part is configured to be lifted from a closed state to an open state by means of a lifting magnet attached to or integrated in the first fixed part. The lifting magnet is configured to interact with the superconductor to generate a lifting force when the pressing magnet is inactive Similar to the pressing force, the lifting force is generated due to the Meissner Ochsenfeld effect. However, the lifting force is directed opposite to the pressing force. In this way, fast and easy lifting of the movable part is realized. The superconductor may be formed with a central pressing module or portion and a separate lifting module or portion. For example, the lifting module or portion is arranged laterally to the central pressing portion and directly above the lifting magnet in the closed state of the press. Alternatively or in addition, the central pressing portion of the superconductor can be formed to extend into the magnetic field of the lifting magnet in a closed state of the press, such that interaction with the lifting magnet for generating a lifting force is possible in the closed state.

According to an embodiment, the lifting magnet is arranged laterally next to the first pressing tool. In particular, the lifting magnet is formed as a plurality of electro magnets arranged laterally next to the pressing tool. For example, in case of a rectangular first fixed part, a lifting magnet may be arranged at opposite sides and/or in each corner thereof.

According to another embodiment, the superconductor is attached to or integrated in the second fixed part. In this way, the super conducting material is separated from the pressing tool. This may be advantageous from a thermal point of view, because the super conducting material needs very low temperature for forming a diamagnet. In particular in case the second pressing tool is heated, isolation between the super conducting material and the pressing tool can be omitted. However, even if the second pressing tool is non-heated, the pressing force and deformation of the component would generate heat, which does not affect the super conducting material.

According to an embodiment, the second fixed part further comprises a cryostat configured for cooling super conducting material of the super conductor below its step temperature to form a diamagnet. In this way, the cryostat is arranged separated from the pressing tool, which is advantageous from a thermal point of view, in particular in case the pressing tool is heated.

According to an embodiment, the pressing magnet is configured fixed with the movable part. In particular, the pressing magnet may be formed integrated with the movable part. Accordingly, the pressing magnet is movable only together with the movable part. In this way, a magnetic field established at the movable part by means of the pressing magnet interacts with the superconductor to apply the pressing force pressing the movable part towards the first fixed part. In this configuration an improved thermal design of the press can be realized. The pressing magnet due to its ohmic resistance generates heat in an active state. This heat may be used for heating the second pressing tool or at least for slowing down cooling thereof.

According to an embodiment, the pressing magnet is arranged in alignment with the first and the second pressing tool. In this way, flux of forces is straightly directed from the second fixed part via the movable part comprising the second pressing tool to the first fixed part comprising the first pressing tool, when the pressing force is applied. Therefore, the pressing force is applied to the pressing tools in a very effective way.

According to another embodiment, the first pressing tool or the second pressing tool or both are configured heatable for consolidation of a thermoplastic composite component. For example, the first and second tools may be configured pre-heatable, meaning configured to be heated up in advance of the consolidation process. In particular, the first and second pressing tools may be configured to be preheated externally, e.g, by induction, in an external oven or the like. Alternatively or in addition, the first and/or second pressing tool may be configured actively heatable. In this case, heating means maybe integrated into the respective first and/or second pressing tool such that it can be heated during the consolidation process.

According to an embodiment, the press comprises a plurality of movable parts together forming the second pressing tool. This may be particularly advantageous in case of a curved first pressing tool. The plurality of movable parts can then be pressed towards the first fixed part comprising the curved first pressing tool in a manner locally adapted to the curvature. Furthermore, the plurality of movable parts may be advantageous in case of variable thickness of the component to be formed. In particular, the pressure thus can be applied locally adapted to the thickness.

According to an embodiment, the pressing magnet comprises a plurality of electro magnets arranged in accordance with the locally desired direction of the pressing force. Furthermore, alternatively or in addition, the plurality of electro magnets may be arranged in accordance with the locally desired strength of the pressing force. In this way, also complex parts can be formed.

According to an embodiment of the method for pressing a thermoplastic composite component, the method further comprises heating the first or second pressing tool or both of them for consolidation of the thermoplastic composite component. In this way, forming and consolidation of the component is possible in one step.

BRIEF DESCRIPTION OF THE DRAWINGS

The invention will be explained in greater detail with reference to exemplary embodiments depicted in the drawings as appended.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. In the figures, like reference numerals denote like or functionally like components, unless indicated otherwise.

Although specific embodiments are illustrated and described herein, it will be appreciated by those of ordinary skill in the art that a variety of alternate and/or equivalent implementations may be substituted for the specific embodiments shown and described without departing from the scope of the present invention. Generally, this application is intended to cover any adaptations or variations of the specific embodiments discussed herein.

DETAILED DESCRIPTION OF THE PREFERRED EMBODIMENTS

Figure 1A:
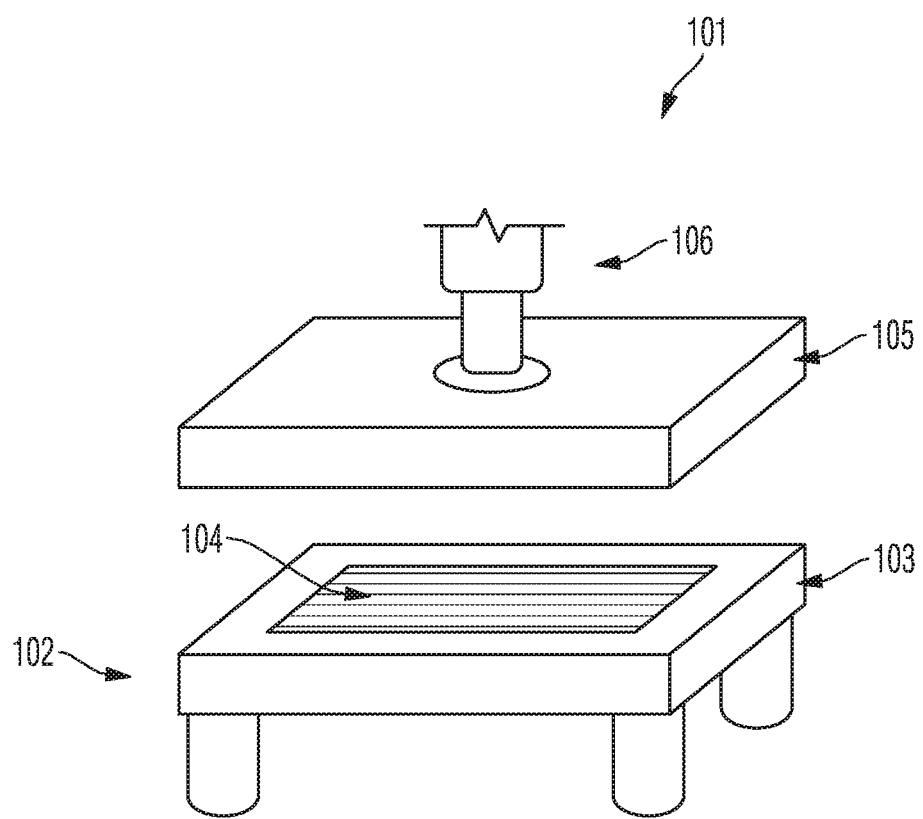
FIG. 1A schematically illustrates a hydraulic press in an open state.

FIG. 1A schematically illustrates a hydraulic press 101 in an open state.

In FIG. 1A reference sign 102 denotes a table 102. The table to serves as a fixed part 103 of the hydraulic press 101 and includes a pressing tool 104. A thermoplastic part to be pressed may be inserted in the pressing tool 104.

Furthermore, the hydraulic press 101 comprises a movable part 105 operated by a hydraulic cylinder 106 and configured to apply pressure to the pressing tool 104.

An opposite end of the hydraulic cylinder 106 is part of or attached to a second fixed part, which is not shown. Details of the hydraulic system and corresponding electric system, in particular components such as a hydraulic fluid reservoir and electric circuitry, (not shown) of such a hydraulic press 101 are generally known by a person skilled in the art and therefore not described herein in more detail.

Figure 1B:
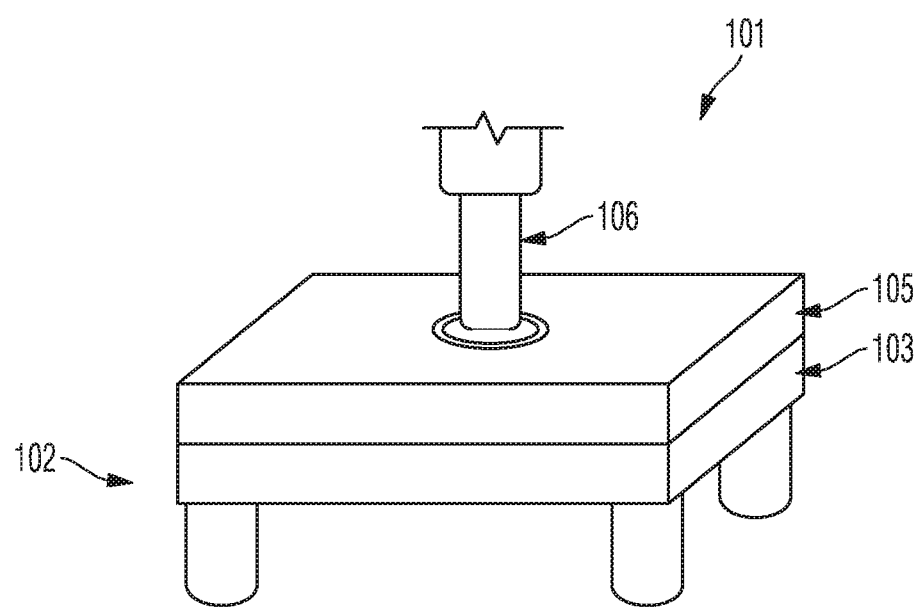
FIG. 1B schematically illustrates the hydraulic press of FIG. 1A in a closed state.

FIG. 1B schematically illustrates the hydraulic press 101 of FIG. 1A in a closed state.

In the closed state shown, the movable part 105 is moved towards the first fixed part 103. Therefore, pressure may be applied to a thermoplastic composite part inside the pressing tool 104 for consolidation. In particular, a combination of heat and pressure is applied to the thermoplastic composite part for consolidation for a predetermined time cycle.

Consolidation comprises, in particular, compression of the laminate of the thermoplastic composite part and removal of air bubbles and other inclusions. Furthermore, in case the fibers are not completely impregnated before the consolidation, full impregnation of fibers may take place. Additionally, so called autohesion, meaning auto-diffusion of thermoplastic-polymer chains in adjacent layers, resulting in a strong bonding may take place if the predetermined time cycle is long enough.

Figure 2A:
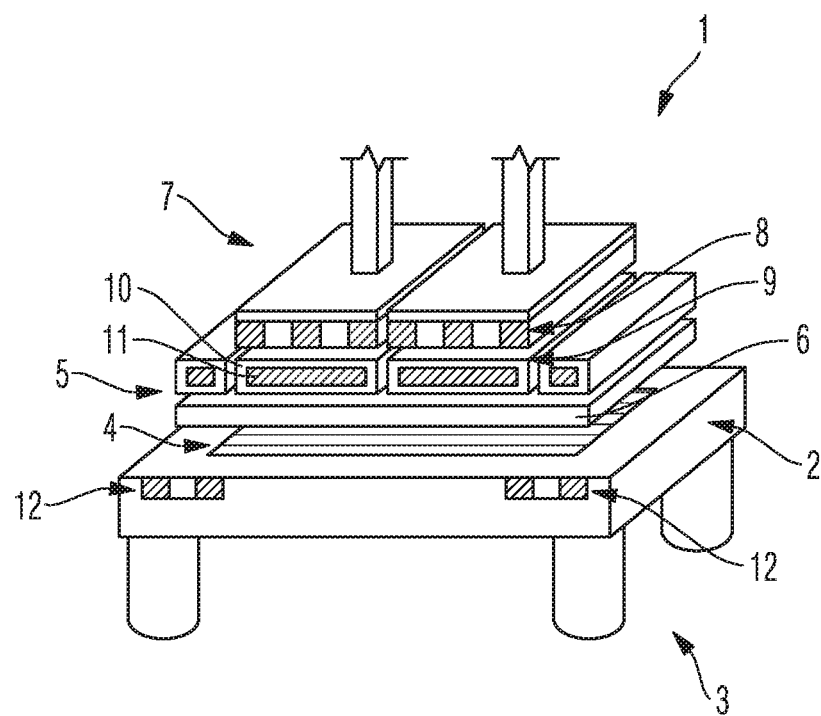
FIG. 2A schematically illustrates a thermoplastic consolidation press according to an embodiment in an open state.

FIG. 2A schematically illustrates a thermoplastic consolidation press 1 according to an embodiment in an open state.

The press 1 comprises a first fixed part to a second fixed part 7 and a movable part 5. The movable part 5 is arranged between the first fixed part 2 and the second fixed part 7.

Purely for example, the first fixed part 2 in the embodiment shown is configured as a top of a massive table 3. The first fixed part comprises a first pressing tool 4, in which a component to be formed may be placed.

The movable part 5 comprises a second pressing tool 6. The first pressing tool 4 and the second pressing tool 6 together define a shape in which the component is to be formed.

Furthermore, the movable part 5 comprises a superconductor 9. In the exemplary embodiment shown, a plurality of four superconductor modules is provided fixed with the movable part 5, wherein two central big modules of superconductors 9 are intended for interaction with a pressing magnet 8 and two lateral small modules of superconductors 9' are intended for interaction with a lifting magnet 12, as will be explained in detail below.

Each module of superconductors 9, 9' comprises a super conducting material 11 arranged in a cryostat 10. The cryostat 10 is configured for cooling the super conducting material 11 below its step temperature. Various superconducting materials 11 may be used, such as, for example, metallic, ceramic or ferritic materials. The step temperature depends on the super conducting material used. Once a temperature under the step temperature is reached, the super conducting material functions as a diamagnet. A "temperature under the step temperature" is to be understood as a temperature of diamagnetic function of the superconductor, which, in particular, may also be near under or technically equal to the step temperature.

The cryostat 10 may be realized, for example, as a bath-cryostat. In this case, the superconductor 9 is cooled by means of a cryo-liquid, for example by means of liquid nitrogen if the step temperature is above the boiling point of nitrogen (−195.8° C.). Alternatively, the cryostat may be cooled, for example, by means of liquid helium, the boiling temperature of which is even lower (−268.9° C.). Due to these very low temperatures in the cryostat 10, the cryostat 10 comprises effective isolation.

The pressing magnet 8 is attached to the second fixed part 7, the absolute fixation of which is symbolized in FIG. 2A by cut-off pillars. The pressing magnet 8 is formed with a plurality of electro magnets arranged in such a way that a magnetic field established at the second fixed part 7, by means of the pressing magnet 8, interacts with the superconductor 9. This means, in the open state of the press 1 as shown in FIG. 2A, the superconductor 9, in particular the super conducting material 11 thereof, is arranged in a magnetic field established by the pressing magnet 8, if the pressing magnet 8 is active. If the superconductor 9 is cooled below its step temperature to function as a diamagnet, interaction with the magnetic field results in a pressing force moving and pressing the movable part 5 towards the first fixed part 2.

Figure 2B:
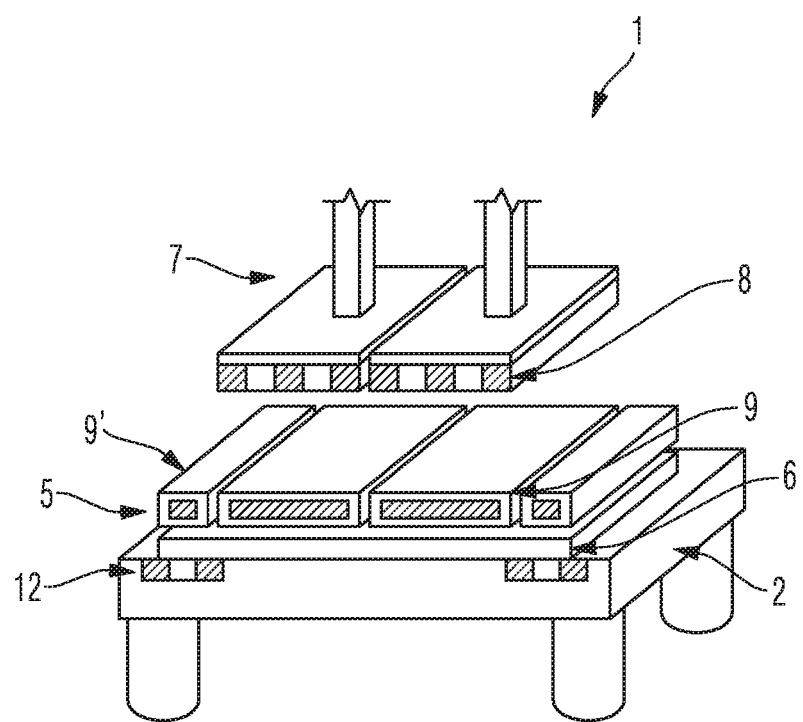
FIG. 2B schematically illustrates the thermoplastic consolidation press of FIG. 2A in a closed state.

FIG. 2B schematically illustrates the thermoplastic consolidation press of FIG. 2A in a closed state.

For reaching the closed state shown in FIG. 2B starting from the open state of FIG. 2A, the movable part 5 is moved from the second fixed part 7 towards the first fixed part 2. Accordingly, in the closed state, a pressing force can be applied to a component inserted in the first pressing tool 4 in that the movable part is pressed towards the first fixed part 2. In this way, the pressing force is transferred via the second pressing tool 6 to the component.

For calibration of the press, the movable part is moved towards the first fixed part under maximum magnetic field. In this way, a memory state for the magnetic field repelled from the superconductor 9 is created. If the movable part 5 is lifted again towards the 2nd fixed part and the component inserted into the pressing tool, another activation of the pressing magnet 8 will immediately reestablish the memory state such that the movable part is pushed back into the closed state by a force resulting from the interaction of the magnetic field with the superconductor. In this way, a pressure is applied to the component, which easily reaches the pressure needed for consolidating a thermoplastic composite component. Furthermore, only small amount of energy is needed to keep the superconductor, meaning the complete movable part 5, in the closed state with the pressing force applied.

For consolidation of a thermoplastic composite component, the pressing tools 4, 6 can be heated. For example, the pressing tools 4, 6 are preheated externally, e.g, by means of induction or in an external oven. In other embodiments, a thermo-active element may be integrated in the press 1 for heating the pressing tools 4, 6.

Once the consolidation is finished, the pressing magnet is deactivated and the movable part 5 can be lifted again into the open state shown in FIG. 2A. In the present embodiment, lifting the movable part is realized by lifting magnets 12, in particular a couple of opposite lifting magnets 12, integrated in the first fixed part 2 of the press 1.

The lifting magnets 12 are positioned laterally to the first pressing tool 4. Furthermore, the movable part 5 comprises two corresponding laterally positioned lifting modules of superconductors 9'. The lifting modules are of smaller dimension compared to the central modules of superconductors 9. The lifting magnets 12 are also arranged laterally and configured to interact with the lifting modules of superconductors 9' to generate a lifting force to lift the movable part 5, when the pressing magnet 8 is inactive.

For controlling the electro magnets of the pressing magnet 8 and the lifting magnet 12, either automatically or in response to an input by a user, a suitable control device (not shown) may be used.

Figure 3:
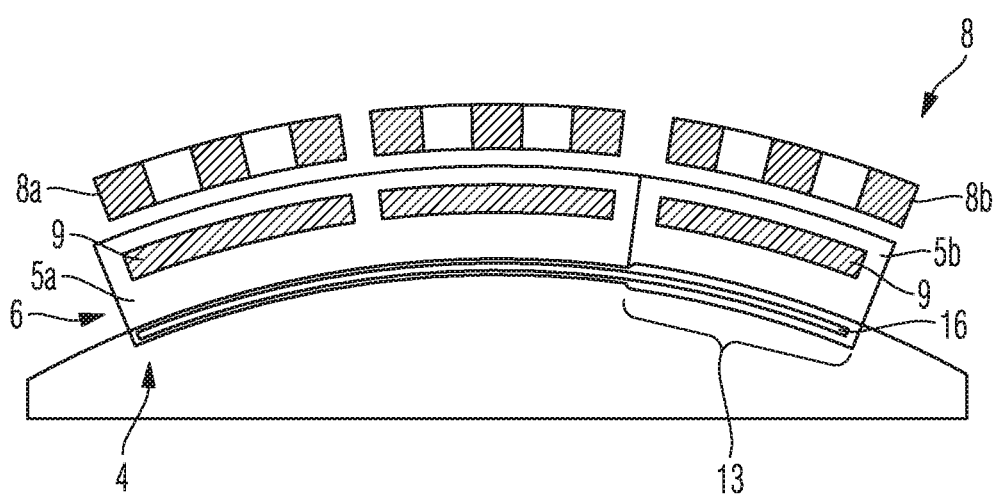
FIG. 3 schematically illustrates a partial sectional view of parts of a thermoplastic forming press according to another embodiment.

FIG. 3 schematically illustrates a partial sectional view of parts of a thermoplastic forming press 1 according to another embodiment.

For better overview, only the first pressing tool 4 as a part of the first fixed part 2 and the pressing magnet 8, which is attached to the second fixed part (not shown), are depicted.

The embodiment of FIG. 3 differs from the embodiment of FIGS. 2A and B in that the first pressing tool 4 is curved and in that two movable parts 5*a*, 5*b* are provided, which together form the second pressing tool 6. In this way, the press 1 is configured for consolidation and forming of a thermoplastic composite component 16 according to the curvature of the first pressing tool 4.

Furthermore, the pressing magnet 8 comprises a plurality of electro magnets 8*a*, 8*b* arranged in orientation in accordance with the curvature of the first pressing tool 4. In this way, the movable parts 5*a*, 5*b* are movable in different orientation locally corresponding to the curvature.

The first and second pressing tools 4, 6 comprise an area of alternating laminate thickness 13, in which the thickness of the thermoplastic composite component 16 to be formed is locally enhanced. Therefore, the pressing force to be applied for forming and consolidation in the area of alternating laminate thickness 13 differs from the rest of the pressing tools 4, 6. In the embodiment shown, application of different pressure is realized by the first and second movable parts 5*a*, 5*b*. The first movable part 5*a* is arranged in the area of the rest of the pressing tools 4, 6 and the second movable part 5*b* is arranged in the area of alternating laminate thickness 13. In this way, the movable parts 5*a*, 5*b* can be individually adapted for providing the locally desired pressure.

The superconductors 9 according to this embodiment are arranged integrated into the movable parts 5*a*, 5*b*. Therefore, the superconductor 9 integrated in the second movable part 5*b* and/or the corresponding electromagnets 8*b* arranged to interact with the second movable part 5*b* are adapted to provide for the desired pressing force in the area of alternating laminate thickness 13. In particular, the strength of the magnetic field and/or the surface and/or volume of the superconductor are adapted accordingly. In this way, individual pressure, heat and duration of the consolidation process can be obtained for different parts of the thermoplastic composite component 16 to be formed.

Figure 4A:
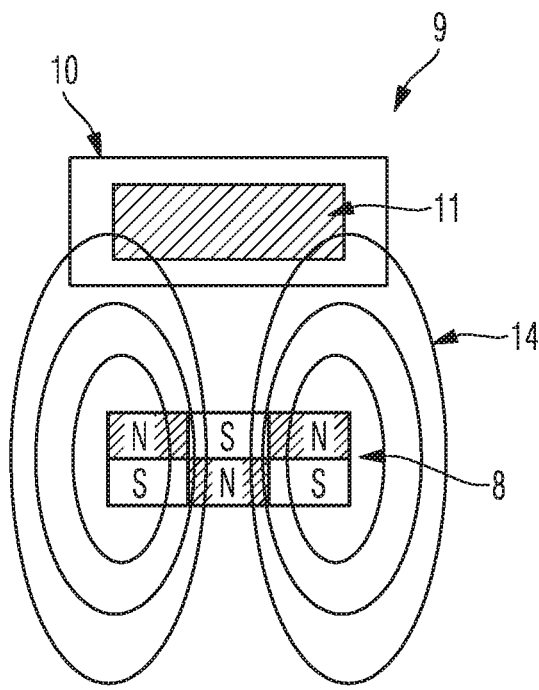
FIG. 4A schematically illustrates a superconductor arranged in a magnetic field.

FIG. 4A schematically illustrates a superconductor arranged in a magnetic field. The illustration serves for explanation of the Meissner-Ochsenfeld effect and the resulting force, which according to the present invention is applied as a pressing force.

FIG. 4A shows a superconductor 9 comprising the super conducting material 11 enclosed in the casing containing cooling liquid to form a cryostat 10. For example, the cryostat 10 is configured as a bath-cryostat such that the super conducting material 11 is embedded in the cryostat liquid, for example liquid nitrogen.

In the state of FIG. 4A, the temperature of the superconductor 9 is above the step temperature.

Beneath the cryostat 10, a pressing magnet 8 is arranged causing a magnetic field 14. This magnetic field 14 penetrates the superconductor 9.

Figure 4B:
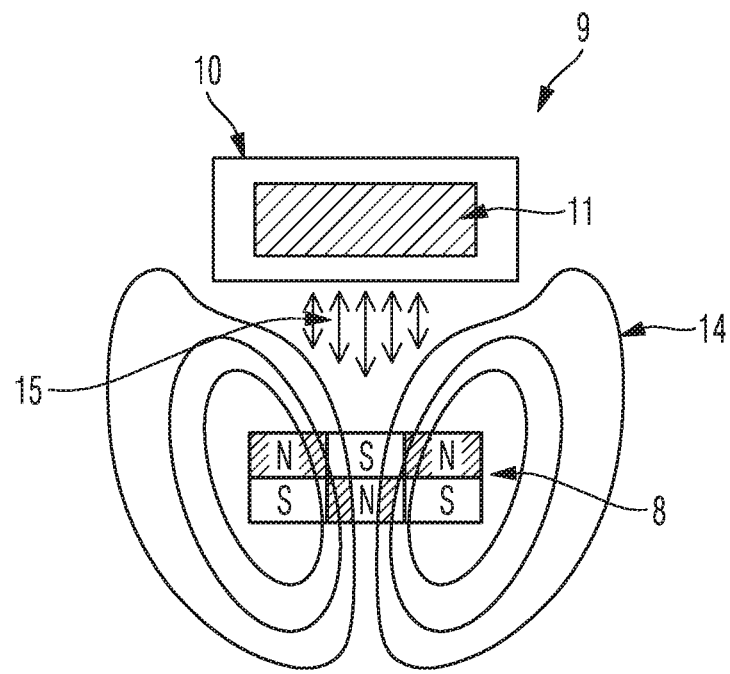
FIG. 4B schematically illustrates interaction of the superconductor of FIG. 4A cooled below its step temperature with the magnetic field.

FIG. 4B schematically illustrates interaction of the superconductor 9 of FIG. 4A cooled below its step temperature with the magnetic field 14.

When the temperature of the super conducting material 11 is cooled below the step temperature by means of the cryostat 10, the magnetic field 14 by means of the Meissner Ochsenfeld effect is repelled from the superconductor 9 and a resulting field of forces 15 ("frozen flux") is established between the superconductor 9 and the magnet 8.

Therefore, once the magnetic field 14 is applied, the superconductor 9 may be locked in a specific position ("memory state"), deviation of which is connected with high considerable forces compared to the size and weight of the superconductor 9 and the magnet 8. This effect is used according to the present invention in the press 1 for applying the pressing force, in particular to consolidate a thermoplastic composite component 16.

Although specific embodiments of the invention are illustrated and described herein, it will be appreciated by those of ordinary skill in the art that a variety of alternate and/or equivalent implementations exist. It should be appreciated that the exemplary embodiment or exemplary embodiments are examples only and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

For example, it will be appreciated that the arrangement of the electromagnet 8 and the superconductor 9 may be inverted. This means, the electromagnet 8 may be attached to the movable part 5 and the superconductor 9, meaning the cryostat 10 with the superconducting material 11, may be attached to the second fixed part 7. In this case, interaction of the magnetic field with the diamagnetic superconductor has a similar effect of a resulting pressing force applied to the movable part 5.

Furthermore, it will be understood that according to an embodiment instead of providing separate lifting superconductors 9', also the dimension of the central superconductors 9 could be extended into the lateral region of the movable part 5, such that the lifting magnets 12 may interact with them to lift the movable part 5.

Furthermore, according to an embodiment, instead of lifting magnets 12 other kinds of drivers for lifting the movable part 5 may be used.

It will also be appreciated that in this document the terms "comprise", "comprising", "include", "including", "contain", "containing", "have", "having", and any variations thereof, are intended to be understood in an inclusive (i.e. non-exclusive) sense, such that the process, method, device, apparatus or system described herein is not limited to those features or parts or elements or steps recited but may include other elements, features, parts or steps not expressly listed or inherent to such process, method, article, or apparatus. Furthermore, the terms "a" and "an" used herein are intended to be understood as meaning one or more unless explicitly stated otherwise. Moreover, the terms "first", "second", "third", etc. are used merely as labels, and are not intended to impose numerical requirements on or to establish a certain ranking of importance of their objects.

The invention claimed is:

1. A press for pressing a component, the press comprising:
   a first fixed part comprising a first pressing tool;
   a movable part comprising a second pressing tool for pressing a component together with the first pressing tool; and
   a second fixed part for applying a pressing force to the movable part,
   a superconductor having a step temperature located in one of the movable part or the second fixed part and a pressing magnet located in the other of the movable part or the second fixed part,
   a cryostat located in the one of the movable part or the second fixed part with the superconductor and configured for cooling a superconducting material of the superconductor below its step temperature to form a diamagnet,
   wherein the second fixed part and the movable part are configured to apply the pressing force generated via interaction between a magnetic field of the pressing magnet and the superconductor cooled below its step temperature.

2. The press of claim 1, wherein the superconductor is configured fixed with the movable part.

3. The press of claim 2, wherein the superconductor is formed integrated with the movable part.

4. The press of claim 1, wherein the pressing magnet is configured attached to or integrated in the second fixed part such that a magnetic field established at the second fixed part by means of the pressing magnet interacts with the superconductor to apply the pressing force to the movable part and to press it towards the first fixed part.

5. The press of claim 1, wherein the movable part is configured to be lifted from a closed state to an open state by means of a lifting magnet attached to or integrated in the first fixed part, wherein the lifting magnet is configured to interact with the superconductor to generate a lifting force when the pressing magnet is inactive.

6. The press of claim 5, wherein the lifting magnet is arranged laterally next to the first pressing tool.

7. The press of claim 6, wherein the lifting magnet is arranged in form of a plurality of electro magnets.

8. The press of claim 1, wherein the superconductor is attached to or integrated in the second fixed part.

9. The press of claim 8, wherein the pressing magnet is configured fixed with the movable part such that a magnetic field, established at the movable part via the pressing magnet, interacts with the superconductor to apply the pressing force to the movable part and press it towards the first fixed part.

10. The press of claim 9, wherein the pressing magnet is formed integrated with the movable part.

11. The press of claim 9, wherein the second fixed part further comprises a cryostat configured for cooling super conducting material of the super conductor below its step temperature to form a diamagnet.

12. The press of claim 1, wherein the pressing magnet is arranged in alignment with the first and the second pressing tool.

13. The press of claim 1, wherein at least one of the first and second pressing tools is configured heatable for consolidation of a thermoplastic composite component.

14. The press of claim 1, wherein the press comprises a plurality of movable parts together forming the second pressing tool.

15. The press of claim 1, wherein the pressing magnet comprises a plurality of electro magnets arranged in accordance with at least one of the locally desired direction and strength of the pressing force.

* * * * *